United States Patent [19]
Boe

[11] Patent Number: 6,045,386
[45] Date of Patent: Apr. 4, 2000

[54] CIRCUIT BOARD RETAINING DEVICE

[75] Inventor: Craig L. Boe, Nampa, Id.

[73] Assignee: Micron Electronics, Inc., Nampa, Id.

[21] Appl. No.: 09/070,002

[22] Filed: Apr. 30, 1998

[51] Int. Cl.[7] .................................................. H01R 9/09
[52] U.S. Cl. .......................................... 439/327; 439/328
[58] Field of Search .................................. 439/327, 328, 439/62, 357, 358, 325, 630

[56] References Cited

U.S. PATENT DOCUMENTS

| | | | |
|---|---|---|---|
| 4,826,447 | 5/1989 | Forker et al. | 439/328 |
| 4,917,624 | 4/1990 | Yu | 439/328 |
| 5,650,917 | 7/1997 | Hsu | 439/327 |
| 5,660,557 | 8/1997 | Lemke et al. | 439/328 |
| 5,842,880 | 12/1998 | Pei | 439/327 |
| 5,897,393 | 4/1999 | Haftmann | 439/328 |
| 5,902,143 | 5/1999 | Pan et al. | 439/327 |

Primary Examiner—Paula Bradley
Assistant Examiner—Tho D. Ta
Attorney, Agent, or Firm—Knobbe, Martens, Olson & Bear, LLP

[57] ABSTRACT

An apparatus and method for securing a circuit card in a connector. The apparatus includes a frame member that defines an opening that is sized so as to receive the connector therein. The apparatus also includes an anchor member that is adapted to engage with the connector so as to anchor the frame member on the connector. A securing member is attached to the frame member and is adapted to engage with an aperture formed in the circuit card so as to retain the circuit card in electrical connection with the connector. The securing member is movable between a first position, where it secures the circuit card in the connector, and a second position where it is at least partially removed from the plane of the opening in the frame member so as to allow the circuit card to be positioned in electrical contact with the connector.

24 Claims, 4 Drawing Sheets

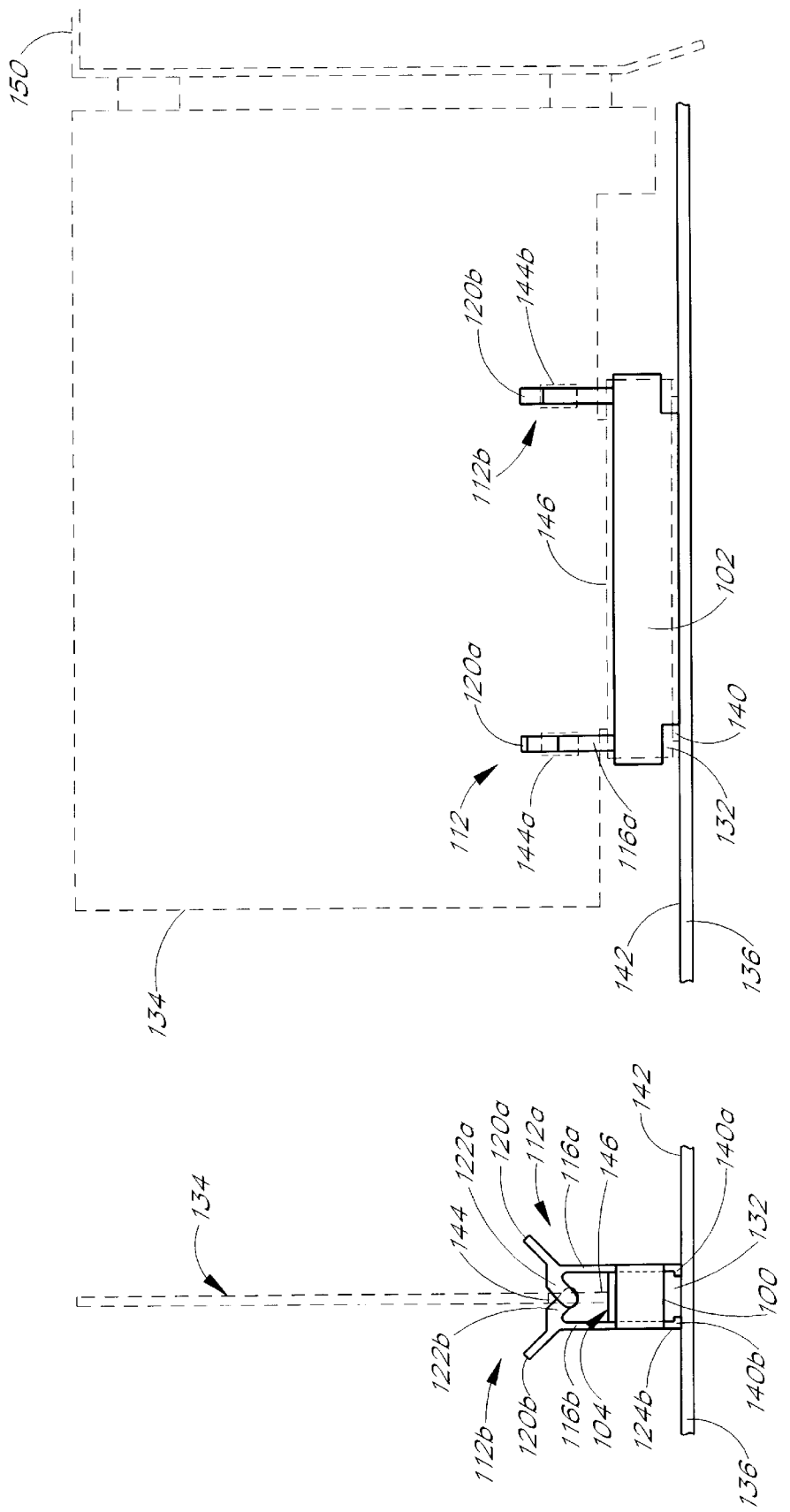

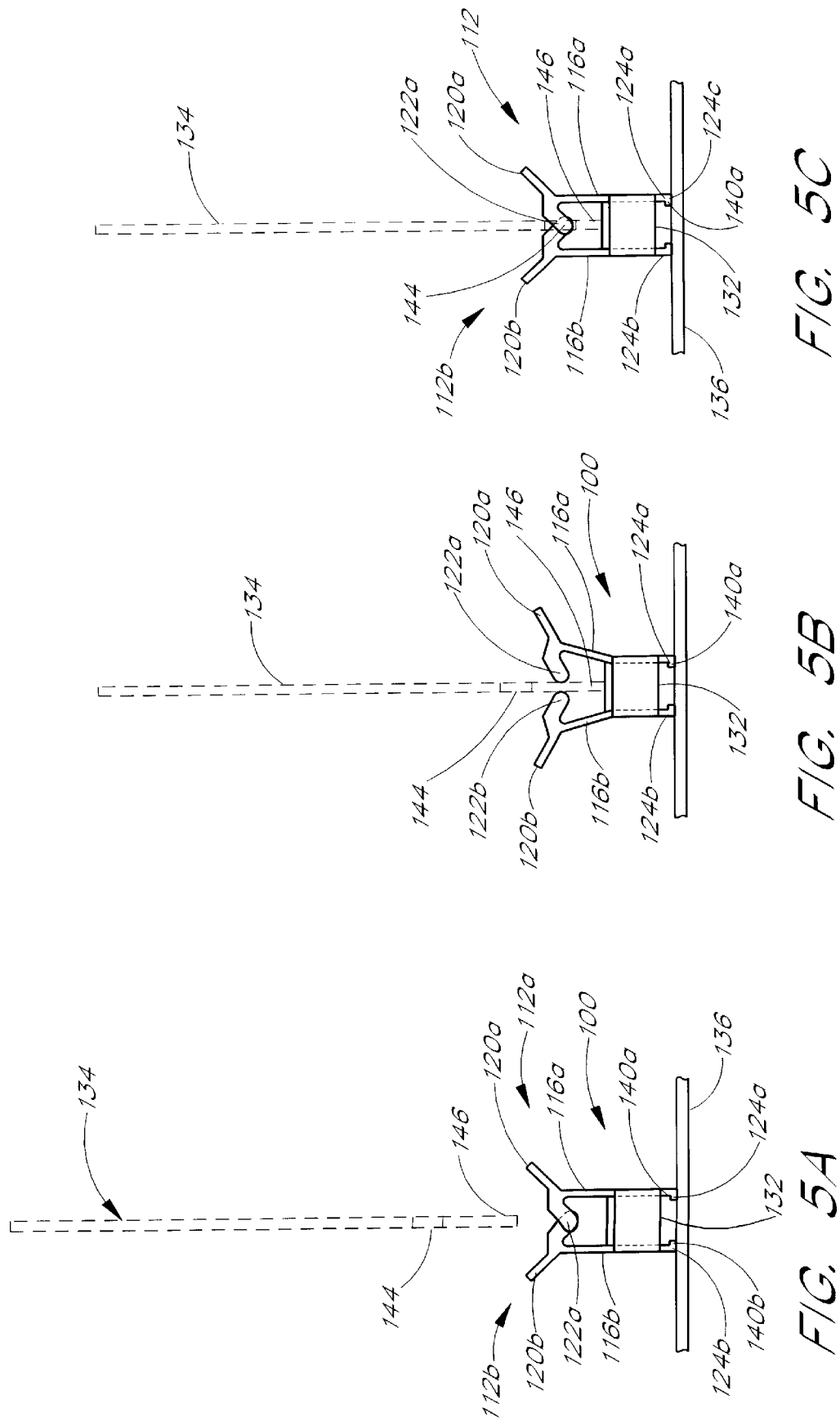

CIRCUIT BOARD RETAINING DEVICE

FIELD OF THE INVENTION

The present invention relates to the field of electronics, and, in particular, concerns a device for retaining circuit cards and the like in position in connectors.

BACKGROUND OF THE INVENTION

Electronic devices are widely popular in all aspects of ordinary life. In particular, electronic devices having cards, modules or other interchangeable components have grown in popularity as it has become possible to configure them to suit a particular need, to be upgraded, or to easily replace faulty components. Most often modules or circuit cards connect to other existing components, such as a motherboard in the case of a personal computer, by insertion of a male contact portion into a female receptacle in an electrical connector. The connector usually comprises an elongated slot having a plurality of conducting contacts arranged along the length of the inside walls of the elongated slot that are adapted to engage with corresponding contacts formed on a contact portion of the circuit card.

Undesirably, electronic systems adopting this method and apparatus for connecting a circuit card to a different component via a connector often experience instances where the card dislodges from the connector, thereby disrupting electrical contact between the components. This can result in electrical and physical damage to other components within the electronic device and can also cause the electronic device to not operate properly. The need for more secure electrical connections is increasing as more electronic devices are made to be portable, since the risk of circuit cards or other components being dislodged in such portable devices is increased. Portable computers, hand held electronic devices, electronics incorporated in automobiles, are all examples of portable devices where movement of the device can result in circuit cards and boards being dislodged from connectors. Of course, movement and jostling of electronic devices during shipment also also increases the likelihood of circuit cards becoming dislodged.

A widely adopted response to the problems associated with dislodged circuit cards is to secure the card in the connector. One typical securing system comprises placing a back plate in the shape of an L-bracket on the back edge of the circuit card. The top portion of the back plate includes an aperture, often including threads, which aligns with an opposing aperture in the frame or chassis of the electronic device. A screw, or other retaining device, secures the back plate and circuit card to the chassis.

However, securing the back plate to the chassis typically only secures one end of an otherwise elongated circuit card to the chassis. As a result, when the electronic device including the circuit card is subject to jarring or other random impacts, the end of the card opposite the back plate can still rotate upward out of the connector. The back plate, being attached in only one place to the chassis, essentially acts as a fulcrum about which the circuit card tends to pivot when subjected to enough force. As a consequence, this type of retaining mechanism for circuit cards is not entirely effective in preventing circuit cards from being dislodged from the connectors.

Moreover, the assembly of the electronic devices is complicated by these types of securing devices. Specifically, the assembler must correctly position the circuit card in the connector and then align the back plate and the chassis to then screw or otherwise secure the back plate to the chassis. This process can add a very significant amount of time for assembly of the electronic device. This increase in assembly time can be a very critical cost factor in the production of electronic devices, particularly in the very competitive area of personal computers.

Accordingly there still exists a need for a circuit card or electronic component retaining device which does not suffer from the drawbacks of the prior art, is inexpensive, and may quickly and releasably secure a component, such as a circuit card, in a connector. To this end, there is a need for a securing mechanism that retains the component in the connector and does not require the assembler to undertake significant additional time consuming assembly steps to secure the component in the connector.

SUMMARY OF THE INVENTION

The aforementioned needs are satisfied by the electrical component retaining assembly of the invention which is comprised of a frame member that is adapted to be positioned in a fixed relationship with respect to a second electrical component and a securing member that is attached to the frame member and is adapted to engage with aperture formed in the first electrical component when the first electrical component is engaged with the second electrical component so as to retain the first electrical component in engagement with the second electrical component.

In one embodiment, the assembly is comprised of a frame member that defines an opening that is adapted to receive a connector. A securing member is adapted to be positioned on the frame member so as to extend into the plane of the opening defined by the frame member. The securing member is further adapted to be movable between a first position, where the securing member engages with the aperture in a circuit card to retain the circuit card in engagement with the connector, and a second position, where the securing member is at least partially removed from the plane of the opening defined by the frame member so as to allow the circuit card to be positioned in engagement with the connector.

In another embodiment, the invention provides a method of assembling an electrical device comprising forming an aperture in a first electrical component, positioning the first electrical component in electrical contact with a second electrical component, positioning a frame member adjacent the second electrical component and moving a securing member attached to the frame member so that the securing member engages with the aperture formed int he first electrical component so as to retain the first electrical component in electrical contact with the second electrical component. In one embodiment, the first electrical component is a circuit board and the second electrical component is a connector.

The method and apparatus allows an assembler to rapidly engage the securing device to the electrical components so as to secure the electrical components together without requiring the assembler to engage in time consuming tasks such as tightening fasteners and the like. These and other objects and advantages of the invention will become more apparent from the following description taken in conjunction with the accompanying drawings.

BRIEF DESCRIPTION OF THE DRAWINGS

FIG. 4A is a side elevation view of the circuit card retaining device of FIG. 1 securing a circuit card in a connector;

FIG. 4B is an end elevation view of the circuit card retaining device of FIG. 1 securing a circuit card in a connector; and FIGS. 5A–5C are isometric views which illustrate how the circuit card retaining device of FIG. 1 is used to position and secure a circuit card in a connector.

DETAILED DESCRIPTION OF INVENTION

Figure 1:
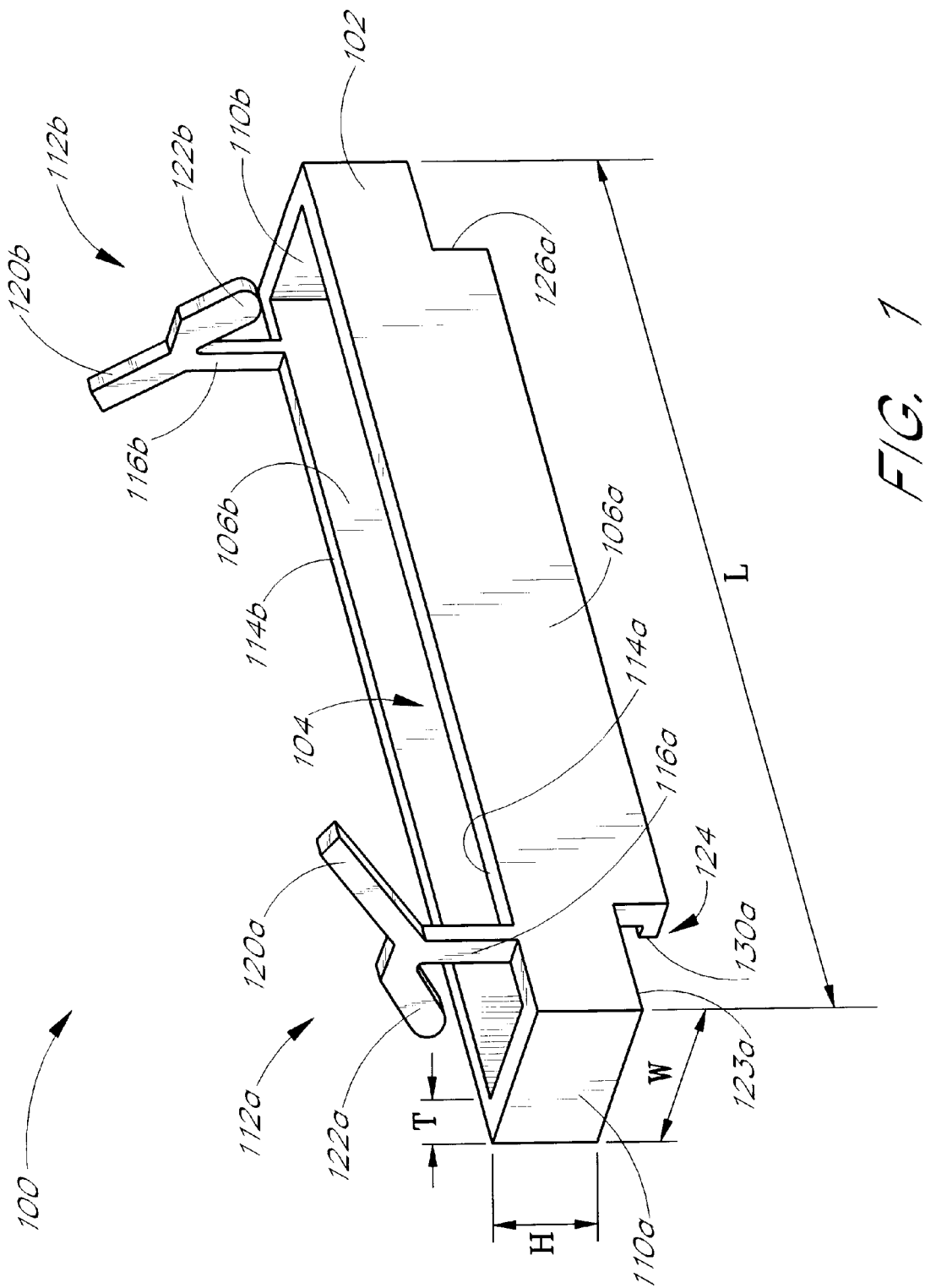
FIG. 1 is a perspective view of one embodiment of a circuit card retaining device.

Reference will now be made to the drawings wherein like numerals refer to like parts throughout. FIG. 1 illustrates one embodiment of an electrical component retaining device 100 that, in this embodiment, is specifically adapted to retain a circuit card in a connector. The retaining device 100 incorporates a frame member 102 that defines the boundaries of an aperture 104. The frame 102 is generally rectangular and is comprised of two sidewalls 106a and 106b and two end walls 110a and 110b so that the aperture 104 defined therebetween is generally rectangular in shape. The frame member 102 of the retaining device 100 in this embodiment is sized so that a connector, adapted to receive a connecting portion of a generally planar circuit card or board, can be positioned within the aperture 104 in the manner that will be described in greater detail below.

As shown in FIG. 1, two securing members 112a and 112b are positioned on an upper rail 114a and 114b of the sidewalls 106a and 106b, respectively. The securing members 112a and 112b are adapted to engage with openings formed in a circuit card so as to secure the circuit card such that the connecting portion of the circuit card is retained within a connector positioned in the aperture 104 in the retaining device 100 in a manner that will be shown and described in greater detail below.

Each of the securing members 112a, 112b include a post 116 which extends upward from the upper rail 114 of the frame member 102. A tab 120 is connected to the post 116 so as to extend generally outward from a plane defined by the mouth of the aperture 104. Further, the securing members 112a, 112b also each includes an engaging member 122, that defines an engagement tip, which extends generally inward toward the plane of the aperture 104. The engaging members 122a, 122b in this embodiment also extend downwardly towards the aperture 104 so as to be able to more securely retain the circuit card in the aperture 104 in a manner that will be described in greater detail below.

As will also be discussed in greater detail below, the posts 116a, 116b of the securing members 112a, 112b are preferably flexible so that when the tabs 120a, 120b are pushed downward by a user, the engaging members 122a, 122b can be retracted at least partially out of the plane of the aperture 104 so as to allow a circuit card to be positioned within the aperture 104. Moreover, the posts 116a, 116b are also made of a generally elastic material such that the removal of the downward pressure on the tabs 120a, 120b will result in the engaging members 122a, 122b moving back into the plane of the aperture 104 into the position shown in FIG. 1.

As is also shown in FIG. 1, the retaining device 100 further includes at least one anchor member 124 that is adapted to anchor the securing member 100 in a position where the securing member 100 can retain a circuit card in a connector. In this embodiment, the anchor members 124a, 124b are positioned on the bottom rails 123a, 123b (See, also FIGS. 2 and 3) of the frame 102. The anchor members 124a, 124b are adapted to anchor the retaining device 100 to a circuit card connector when the circuit card connector is positioned within the aperture 104.

Figure 2:
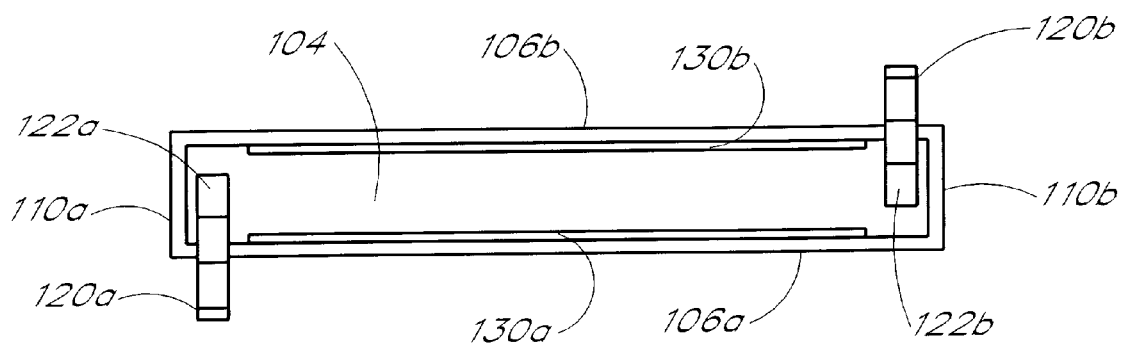
FIG. 2 is a top plan view of the circuit card retaining device of FIG. 1.
Figure 3:
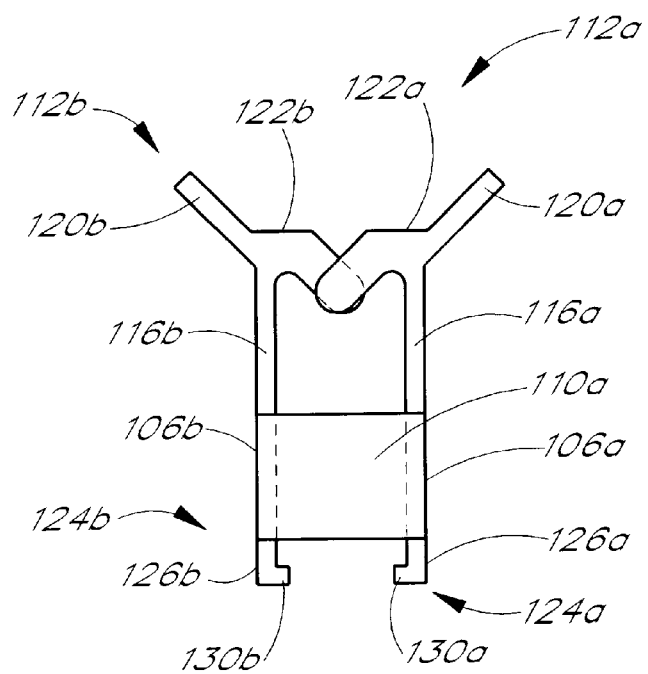
FIG. 3 is an end elevation view of the circuit card retaining device of FIG. 1.

Referring more specifically to FIGS. 2 and 3, the anchor members 124a, 124b include an elongate mounting member 126a, 126b which extends perpendicularly downwardly from the bottom rails 123a, 123b of the frame 102. A lip 130a, 130b is attached to the mounting member 126a, 126b so as to extend perpendicularly inwardly into the plane of the aperture 104. The mounting members 126a, 126b and the lip 130a, 130b are preferably sized so that the lips 130a, 130b can be positioned in a recess defined by the connector in a manner that will be described in greater detail below.

As is also shown in FIGS. 2 and 3, the securing members 112a, 112b are positioned so that the engaging members 122a, 122b extend more than halfway across the width of the plane defined by the aperture 104. As will be discussed in greater detail below, when the retaining device 100 is positioned about a connector, the connector is preferably centered within the aperture 104. An electrical component, such as a circuit card, that is to be positioned in the connector will therefore be positioned so as to extend lengthwise across the aperture 104 and so as to be centered width-wise within the aperture 104. The engaging members 122a, 122b of the securing members 112a, 112b therefore will extend through an opening in the circuit card so as to securely retain the circuit card within the connector that is positioned within the aperture 104. The procedure whereby a circuit card is mounted within a connector that is positioned within the retaining device 100 will be described in greater detail in reference to FIGS. 4A and 4B and FIGS. 5A–5C.

In one embodiment, the retaining device 100 is formed out of molded plastic so that the anchor member 124a, 124b and the securing members 112a, 112b are integrally attached to the frame member 102. In this embodiment, the material used to form the retaining device 100 is a flexible, yet resilient, material so as to allow the securing members 112a, 112b to be resiliently moved in the manner described above. It will be appreciated that the length, width and height of the retaining device 100 as well as the exact configurations of the securing members 112a, 112b and the anchor members 124a, 124b will vary depending upon the size of the connector that is to be positioned within the aperture 104 and will also vary depending upon the size and configuration of the circuit card to be secured in the connector.

FIGS. 4A and 4B illustrate how the retaining device 100 is positioned about a connector 132 and further show how a circuit card 134 can be mounted within the connector 132 and secured therein by the retaining device 100. In particular, the connector 132 is mounted on a planar surface, such as a circuit board, 136 so as to extend perpendicularly outward from the circuit board 136. As shown in FIG. 4A, the connector has two recesses 140a, 140b positioned immediately adjacent the upper surface 142 of the circuit board 136. In this embodiment, the lips 130a, 130b of the anchor members 124a, 124b are adapted to be respectively positioned within the recesses 140a, 140b on the connector. It will, of course, be appreciated that the configuration of the recesses 140a, 140b will vary depending upon the connector and that the anchor members 124a, 124b can be similarly altered so as to be able to anchor the retaining device 100 to the connector 132 with the connector 132 positioned within the aperture 104 of the retaining device 100.

As is also shown in FIGS. 4A and 4B, the circuit card 134 that is to be positioned within the connector 132 is adapted to have two apertures 144a, 144b formed in the circuit card 134. The positions of the apertures 144a, 144b are selected so that when the circuit card 134 is mounted in the connector 132, the apertures 144a, 144b are positioned so as to receive the engagement tips of the engaging members 122a, 122b of the securing members 112a, 112b in the manner shown in FIGS. 4A and 4B. The securing members 112a, 112b in this embodiment, are sized and adapted so that the engagement members 122a, 122b exert a force against the inner surface of the apertures 144a, 144b in the circuit card 134 so as to bias a contact portion 146 of the circuit card 134 into electrical connection with the connector 132. Hence, the retaining device 100 is adapted to be positioned about a connector 132 so that the connector 132 is centered within the aperture 104 and so that the securing members 112a, 112b can engage with the circuit card 134 so as to retain the circuit card in electrical connection with the connector. It will be appreciated that the retaining device 100 is suitable for use with any of a number of different types of connectors including PCI, AGP or ISA-type connectors.

The positioning of the securing members 112a, 112b in the apertures 144a, 144b reduces the likelihood that the circuit card 134 will be dislodged from the connector 132 as a result of movement of the electronic device containing the circuit card 134. Moreover, as shown in FIG. 4B, the retaining device 100 can be used in conjunction with known circuit card retaining rails and assemblies 150 to further ensure that the circuit card 134 is secured within the connector 132 against dislodgement as a result of jostling or handling of the electronic device containing the circuit card 134.

The process by which the circuit card 134 is positioned within the connector 132 and secured therein by the retaining device 100 will now be described in reference to FIGS. 5A–5C. Initially, the retaining device 100 is anchored to the connector 132 which, in this embodiment, is accomplished by positioning the lips 130a, 130b of the anchor members 124a, 124b in the recesses 140a, 140b defined by the interface between the connector 132 and the upper surface 142 of the circuit board 136. In one embodiment, the frame member 102 is resilient so that the frame member 102 can be positioned about the connector 132 while the connector 132 is positioned on the board 136. In this embodiment, the frame member 102 is maneuvered so that the connector 132 is positioned within the aperture 104 and so that the lips 130a, 130b of the anchor members 124a, 124b are respectively positioned within the recesses 140a, 140b. Alternatively, the retaining member 100 can be installed about the connector 132 prior to the connector 132 being mounted on the board 136.

Once the circuit card retaining device 100 is positioned about the connector 132 in the manner shown in FIG. 5A, the circuit card 134 can then be positioned so that the contacting portion 146 of the circuit card 134 is engaged with the connector 132 in a manner that is known in the art. Referring to FIG. 5B, the assembler depresses the tabs 120a, 120b of the securing members 112a, 112b so as to at least partially withdraw the engaging members 122a, 122b from the center of the plane defined by the aperture 104. Withdrawal of the engaging members 122a, 122b creates a space where the circuit card 134 can be positioned between the withdrawn engaging members 122a, 122b so that the circuit card 134 can be inserted so that the contacting portion 146 of the circuit card 134 makes electrical contact with the connector 132. As discussed above, the mounting posts 116a, 116b of the securing members 112a, 112b are formed of a flexible, yet resilient, material so that the engaging members 122a, 122b can be withdrawn from the center of the plane defined by the aperture 104 to permit the circuit card 134 to be positioned within the connector 132.

As shown in FIG. 5C, once the circuit card 134 is correctly positioned within the connector 132, the downward pressure on the tabs 120a, 120b of the securing member 112a, 112b is relaxed thereby allowing the engaging members 122a, 122b of the securing members 112a, 112b to return to their unloaded position shown in FIG. 5C. In this position, the engaging members 122a, 122b are positioned within the apertures 144a, 144b of the circuit card 134. As discussed above, the engaging members 112a, 112b angle towards the connector 132 that is positioned within the aperture 104 so as to bias the circuit card in a direction where the contact portion 146 of the circuit card 134 is urged into the connector 132. Hence, the assembler simply has to position the retaining device 100 about a connector 132 that is positioned on a circuit board 136 and anchor the retaining device 5 100 to the connector 132. Subsequently, the retaining members 112a, 112b are withdrawn to allow the circuit card 134 to be electrically connected to the connector 132 in a manner that is known in the art. The retaining members 112a, 112b are then moved into a position wherein they engage with the circuit card 134 so as to bias the circuit card 134 into electrical connection with the connector 132.

Hence, the retaining device of the illustrated embodiment is capable of providing more than one connection point with the circuit card that is to be retained in the connector. This reduces the likelihood that an end of the circuit card will become dislodged from the connector. Moreover, the assembly of electronic devices is not significantly complicated by the use of the retaining device of the illustrated embodiment. The assembler does not have to do any manipulating of fasteners, such as screws or nuts, as the assembler simply has to position the retaining device on the connector, and then position the securing members in the apertures formed in the circuit card.

It will be appreciated from the foregoing description that the manner in which the retaining device is positioned about and anchored to the connector will vary depending upon the configuration of the connector. For example, the connector may have a protrusion, small aperture or only a single recess and the retaining device will be adapted to engage with this protrusion, recess, or aperture so as to anchor the retaining device 100 on the connector. Moreover, it may be desirable to use an adhesive to also anchor the retaining device 100 on the connector. Alternatively, it may be desirable to make connectors that have retaining devices formed as an integral feature of the connector. Similarly, it will be appreciated that in some circumstances it may be desirable to have only one retaining member 112 or an equivalent, or to have more than two retaining devices 112 depending upon the size shape and configuration of the circuit card 134 that is to be secured within the connector 132.

Hence, although the foregoing description of one embodiment of the invention shows, describes and points out fundamental, novel features of the invention, it will be understood that various omissions, substitutions, and changes in the form of the detail of the apparatus and the method as illustrated as well as the uses thereof, may be made by those skilled in the art without departing from the spirit of the invention. Consequently, the scope of the invention should not be limited to the foregoing discussion but is defined by the appended claims.

What is claimed is:

1. An assembly for holding a first electrical component having a first aperture formed therein in electrical contact with a second electrical component, the assembly comprising:

a frame member that is adapted to be positioned in a fixed relationship with respect to the second electrical component, said frame member defining the boundaries of a second aperture therein, said second aperture defining a planar mouth bounded by edges of said second aperture; and a securing member that is attached to the frame member, wherein said securing member comprises an engaging member extending downwardly toward said second aperture, wherein said engaging member extends more than halfway across the width of said planar mouth, and wherein said engaging member is adapted to engage with the first aperture in the first electrical component when the first electrical component is engaged with the second electrical component so as to retain the first electrical component in engagement with the second electrical component.

2. The assembly of claim 1, wherein the securing member is adapted to engage with an aperture in a printed circuit card and wherein the frame member is adapted to be anchored adjacent a connector.

3. The assembly of claim 1, wherein a tip of said engagement member exerts a force against an inner surface of said first aperture when the first electrical component is engaged with the second electrical component.

4. The assembly of claim 1, wherein said second aperture is adapted to receive the second electrical component and wherein the first electrical component is adapted to extend outward from the planar mouth when the first and second electrical components are in engagement.

5. The assembly of claim 4, further comprising an anchor member that is adapted to engage with the second electrical component so as to anchor the frame member about the second electrical component that is positioned within said second aperture in the frame member.

6. The assembly of claim 5, wherein the anchor member is comprised of a protrusion that engages with a recess defined by the second electrical component.

7. The assembly of claim 4, wherein the securing member includes an engagement tip that is movable between a first position and a second position, wherein the engagement tip in the first position is adapted to be positioned within the aperture in the first electrical component when the first electrical component and the second electrical component are in engagement and wherein the engagement tip in the second position is removed from said planar mouth so as to permit the first electrical component to be positioned in engagement with the second electrical component.

8. The assembly of claim 7, wherein the engagement tip is adapted to exert force against the first electrical component and in a direction towards said planar mouth, when the engagement tip is positioned in the aperture in the first electrical component and the first electrical component is engaged with the second electrical component, so as to retain the first and second electrical components in engagement therewith.

9. The assembly of claim 8, wherein the securing member includes a flexible post that is attached to the frame member and a tab that is attached to the flexible post so that when force is exerted on the tab, the engagement tip is urged from the first position into the second position.

10. The assembly of claim 9, wherein the flexible post is adapted to bias the engagement tip into the first position.

11. An assembly for securing a circuit card having an aperture formed therein to a connector, the assembly comprising:

a frame member defining an opening that is adapted to receive the connector, said frame member also defining a planar mouth adapted to receive said circuit card;

means for anchoring the frame member to the connector; and means for securing the circuit card in electrical contact with the connector, said means for securing comprising an engaging member attached to the frame member and extending downwardly toward said planar mouth, more than halfway across the width of said planar mouth, and terminating in an engagement tip adapted to contact an inner surface of said aperture formed in said circuit card.

12. The assembly of claim 11, wherein the means for anchoring comprises a protrusion that is adapted to extend into a recess defined by the connector so as to anchor the frame member to the connector when the connector is positioned within the opening in the frame member.

13. The assembly of claim 11, wherein the means for securing includes means for removing the engagement tip from the aperture and biasing means which biases the engagement tip into the aperture.

14. An assembly for securing a circuit card having an aperture formed therein in electrical contact with a connector, the assembly comprising a frame member defining a planar mouth for accepting said circuit card therethrough, a securing member fixedly mounted to the frame, member with respect to the connector, wherein the securing member is movable between a first position and a second position and wherein when the securing member is in the first position and the circuit card is electrically engaged with the connector, a tip of said securing member extends more than halfway across the width of said planar mouth and engages with an inner surface of the aperture in the circuit card so as to retain the circuit card in the connector.

15. The assembly of claim 14, wherein the securing member is adapted so that when the securing member is in the second position, the securing member is removed from said planar mouth so as to allow a contact portion of the circuit card to be positioned in electrical contact with the connector.

16. The assembly of claim 14, further comprising an anchor member that is adapted to anchor the assembly in a fixed relationship with respect to the connector.

17. The assembly of claim 16, wherein the anchor member is comprised of a protrusion that is adapted to be positioned within a recess defined by the connector so as to anchor the assembly in the fixed relationship with respect to the connector.

18. A method of assembling an electrical device comprising:

forming an aperture in a first electrical component;

positioning the first electrical component in electrical contact with a second electrical component;

anchoring a frame member to the second electrical component, said frame member defining a planar mouth through which said first electrical component extends when said first electrical component is in electrical contact with said second electrical component; and moving a securing member attached to the frame member so that the securing member extends more than halfway across the width of said planar mouth and a tip of said securing member engages with an inside surface of the aperture formed in the first electrical component so as to retain the first electrical component in electrical contact with the second electrical component.

19. The method of claim 18, wherein the act of forming an aperture in a first electrical component comprises forming an aperture in a circuit card.

20. The method of claim 19, wherein the act of positioning the first electrical component in electrical contact with the second electrical component comprises positioning the circuit card into electrical contact with a connector.

21. The method of claim 20, wherein the act of anchoring the frame member to the second electrical component comprises positioning the frame member about the connector so that the connector is positioned within an opening defined by the frame member and urging a protrusion of the frame member into a recess defined by the connector.

22. The method of claim 21, further comprising the act of retracting the securing member from said planar mouth so as to permit the circuit card to be positioned in electrical contact with the connector.

23. the method of claim 22 wherein the act of retracting the securing member comprising depressing a tab attached to the securing member so as to retract the securing member.

24. The method of claim 23, wherein the act of moving the securing member so that the securing member engages with the aperture in the circuit card comprises releasing pressure on the tab to allow the securing member to resiliently return to a position wherein an engagement tip of the securing member is positioned within the aperture.

* * * * *